March 20, 1962 D. I. POMERANTZ 3,026,424

TRANSISTOR CIRCUIT WITH DOUBLE COLLECTOR

Filed Nov. 12, 1958

*INVENTOR.*
DANIEL I. POMERANTZ

*BY*
[signature]
ATTORNEY

United States Patent Office 3,026,424
Patented Mar. 20, 1962

3,026,424

TRANSISTOR CIRCUIT WITH DOUBLE COLLECTOR

Daniel I. Pomerantz, Lexington, Mass., assignor to Clevite Corporation, Cleveland, Ohio, a corporation of Ohio Filed Nov. 12, 1958, Ser. No. 773,275
11 Claims. (Cl. 307—88.5)

This invention relates to semiconductor devices and, more particularly, to junction transistors.

As is well known in the art a transistor, in its general form, many consist of a wafer of semiconductive material such as germanium or silicon containing selected impurities which determine its conductivity type, i.e., P-type or N-type. On one face of the wafer is an emitter region and on the opposite face a collector region, both regions being of a conductivity-type opposite to that of the wafer and forming therewith respective rectifying P-N junctions. An ohmic connection to the wafer, known as the base, is provided. In operation the emitter and collector regions are biased with opposite polarity relative to the base.

One important factor affecting the gain and efficiency of transistors is the degree of recombination loss, i.e., the percentage of the charge carriers in the semiconductor material which recombine before passing the collector junction. A considerable portion of this recombination loss occurs at the surface of the wafer.

Surface recombination current not only causes loss of gain but, because it is extremely sensitive to environmentally-produced changes in surface properties, it also contributes significantly to instability.

It is a fundamental object of the present invention to provide improved transistors which avoid or overcome at least one of the disadvantages of prior art devices.

More specifically, it is an object of the present invention to provide novel transistors characterized by high gain and stability.

Another object is the provision of novel transistors which are characterized by a high degree of insensitivity to environmental changes and low surface recombination current.

These and further objects are accomplished by novel semiconductor devices in accordance with the present invention which comprise a body of semiconductor material having at least one P-N junction on one of a pair of opposite major surfaces and at least two closely-spaced P-N junctions on the other of said surfaces. An individual terminal connection is provided for one of the junctions on each of the surfaces. One of the junctions on one of the major surfaces is directly electrically connected to a junction on the other major surface and a base electrode is provided making non-rectifying contact with the body.

Additional objects of the invention, its advantages, scope, and the manner in which it may be practiced will be apparent to those conversant with the art from the following description and subjoined claims taken in conjunction with the annexed drawings in which:

Figure 1:
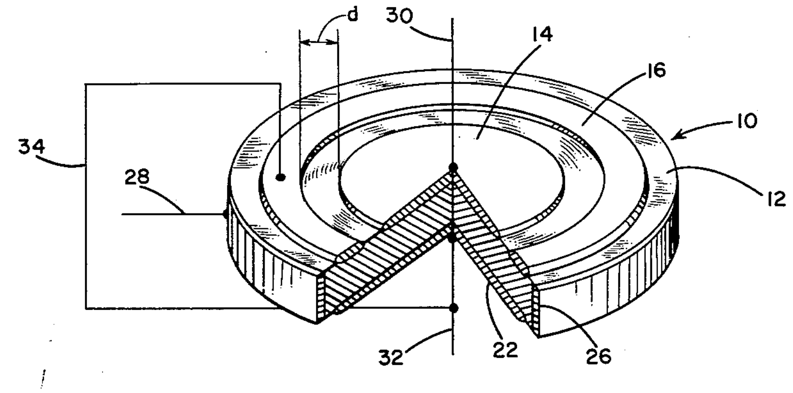
FIGURE 1 is a perspective elevational view, partly in section, illustrating a junction transistor in accordance with the present invention.

Referring now to the drawings, FIGURE 1 illustrates a semiconductor device 10 in accordance with the present invention. In the figure, a circular sector of somewhat less than 90° has been broken away to expose parts which otherwise would be obscured. Device 10 consists of a body 12 of semiconductive material such as germanium or silicon, suitably doped with donor or acceptor impurities, to impart the desired type of conductivity, all in a manner well understood in the art.

Body 12, commonly referred to as a "wafer," is shown as being a thin disk but it will be understood that, while this configuration is convenient and preferred, others may be employed.

On one surface of wafer 12 are regions 14 and 16 of a conductivity-type opposite to that of wafer 12. For ease of description, wafer 12 hereinafter will be considered as N-type; accordingly regions 14 and 16 would be P-type. Regions 14 and 16, which may be formed by alloying or any other suitable method, form with wafer 12 respective P-N junctions 18 and 20, best shown in FIGURE 3, one surrounding the other. In the illustrated embodiment junction 18 is generally circular and centrally located with respect to the wafer; junction 20 is annular and concentric with junction 16.

For reasons which will become apparent as this description proceeds, annular junction 20 should be located as closely as possible to circular junction 18; in any case, the spacing between these junctions should be small as compared to the diffusion length for the charge carriers.

On the opposite surface of wafer 12 is a region 22, of conductivity-type opposite to that of wafer 12 and, therefore, in the exemplary embodiment, P-type. Region 22 forms a circular P-N junction 24 which is concentric with those on the opposite surface and has a diameter approximating the outer diameter of annular outer junction 20.

A base electrode 26 making ohmic contact with wafer 12 is provided, taking the form of a rim of the peripheral edge of the wafer. Terminal lead wires 28, 30 and 32 connected to base electrode 26 and regions 14 and 22, respectively, provide for circuit connections to the transistor. In use, junctions 18 and 24 are biased to operate respectively as emitter and collector.

Figures 2, 3, 4, 5:
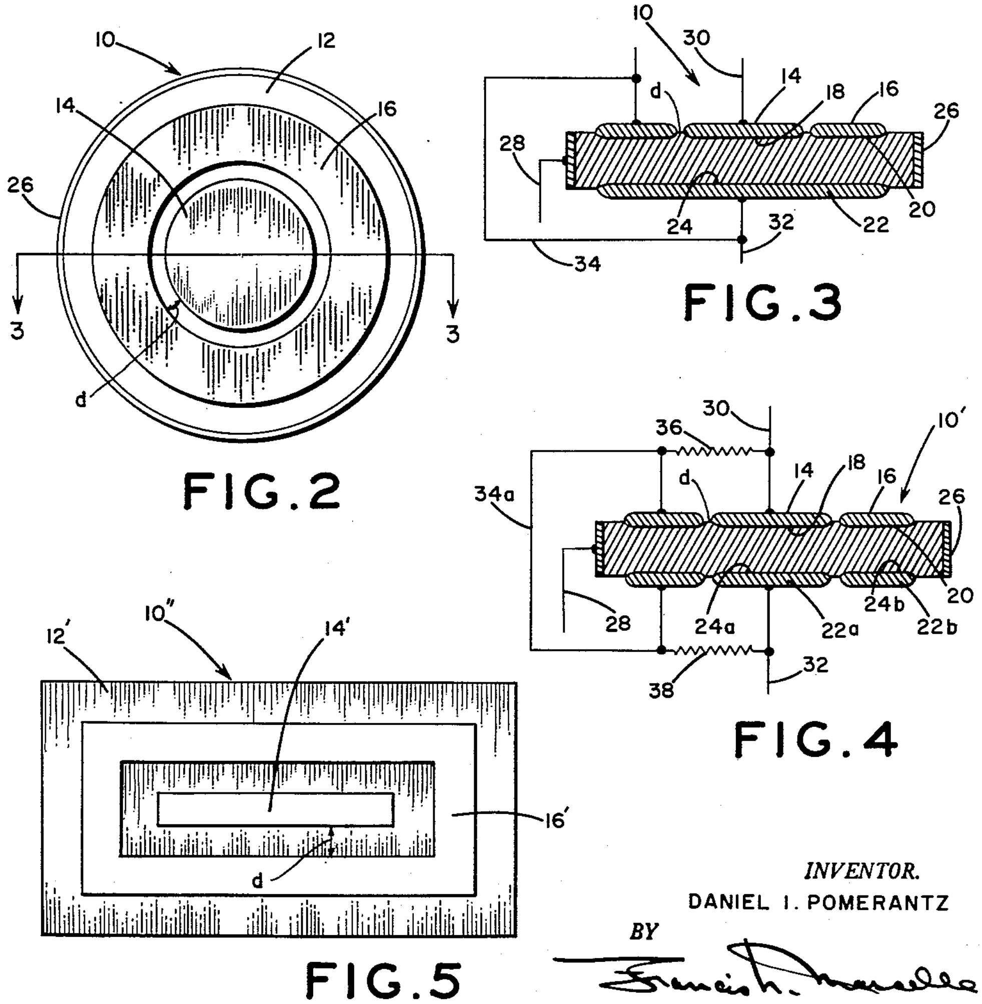
FIGURE 2 is a top plan view of the device shown in FIGURE 1.
FIGURE 3 is a diametral section taken on line 3—3 of FIGURE 2.
FIGURE 4 is a diametral section similar to FIGURE 3 showing a modified embodiment of the present invention.
FIGURE 5 is a top plan view of a modified form of transistor embodying the present invention.

As best appears in FIGURE 3, regions 16 and 22 and, therefore, their respective junctions 20 and 24 with wafer 12 are directly interconnected through a conductor 34 so that both are at the same potential.

In operation, leads 30 and 32 are connected to suitable potentials of opposite polarity with respect to base electrode 26. In the present example based on the assumption of N-type conductivity for wafer 12, yielding a PNP transistor, lead 30 is made positive and lead 32 negative with respect to base electrode 26 so that junction 18, biased forwardly, becomes the emitter. The charge carriers injected into wafer 12 by emitter junction 18 migrate across reverse-biased junction 24 which operates as the collector, all in a manner well understood in the art. As previously explained a certain percentage of the charge carriers injected by emitter 14 recombine before reaching collector junction 24 and, thus, are effectively lost insofar as contributing to gain is concerned. In the transistor described, the annular junction 20, reversed-biased by virtue of its interconnection to junction 24, functions as an additional, or supplementary, collector, collecting charge-carriers which would ordinarily be lost by recombination at the surface of wafer 12 surrounding emitter region 14. To this end the spacing between junctions 20 and 24 is small as compared to the diffusion length of the charge carriers, thus permitting the carriers to be collected before recombination in the bulk material of the base region. As previously stated, avoidance of this recombination not only improves the gain but also the stability of the device.

The principles of the present invention may be applied with advantage to "symmetrical" transistors as disclosed and claimed in copending application Serial Number 759,078 filed September 4, 1958. Such an embodiment of the present invention is illustrated and will now be described with continued reference to FIGURE 4.

The transistor 10' illustrated in FIGURE 4 is, in most respects, identical to that already described. Consequently, corresponding parts are designated with the same reference numerals. Comparison of FIGURES 3 and 4 reveals that the primary distinction in structure between transistors 10 and 10' is that P-type region 22 of the former is replaced in the latter by a circular P-type region **22*a* and a concentric, annular P-type region 22*b*. Regions 22*a* and 22*b* form respective P-N junctions 24*a* and 24*b* which, individually and collectively, are substantially identical in area and in configuration to and are disposed opposite junctions 18 and 20**, respectively.

In describing the FIGURE 4 embodiment, use of the terms "emitter" and "collector" has been avoided inasmuch as the device described is completely symmetrical in operation and the function of the various P-N junctions depends on the direction of bias as will appear presently.

As described in the aforementioned copending application 759,078 individual impedance means, represented by respective resistors 36 and 38, are provided to electrically interconnect regions 14 and 16 on one surface of wafer 12 and regions **22*a* and 22*b* on the opposite surface. Thus, resistor 36 has one end connected to annular P-type region 16 and its other end connected to lead or terminal wire 30 which enables the electrical connection of circular P-type region 14 directly to a source of unidirectional bias potential of suitable magnitude and desired polarity. In like manner, resistor 38 is connected between annular P-type region 22*b* and a lead or terminal wire 32, which enables the electrical connection of circular P-type region 22*a* to a source of unidirection bias potential of suitable magnitude and opposite polarity with respect to that applied to terminal wire 30**.

Resistors 36 and 38 have substantially equal values of ohmic resistance and, individually, comparable to the forward resistance of junction 18 or **24*a*. In a commercial device, resistors 36 and 38, preferably, would be encapsulated or otherwise encased with wafer 12 to form a unitary structure having leads 28, 30 and 32 only protruding for circuit connections. It will be appreciated, however, that resistors 36 and 38 may be provided externally of the encased device and/or may take any suitable form. Thus, for example, resistors 36 and 38 may take the form of respective layers or coatings of resistive material applied to the surfaces of wafer 12 between regions 14 and 16 and between 22*a* and 22*b*. Each such layer could be a complete annulus or could consist of one or more segments connecting the respective regions 14 and 16 or 22*a* and 22*b*** at several points.

In accordance with the present invention, annular P-type regions 16 and **22*b* are directly electrically interconnected as by means of conductor 34*a*** so that both are at the same potential.

In operation, terminals 30 and 32 are connected individually to a source of bias potential rendering one negative and the other positive with respect to base 26. Assuming 30 is positive, P-N junction 18 is forwardly biased and can be regarded as an emitter whereas both junctions **24*a* and 24*b*** are sufficiently reversed biased that both are collecting with high efficiency.

The effective emitter area under the assumed bias conditions, therefore, is substantially equal to the area of P-N junction 18 whereas the collector area is the sum of the areas of P-N junctions **24*a* and 24*b*. Thus, the device is operating, in effect, with a small emitter junction opposed by a larger collector junction which peripherally overlaps the emitter junction, resulting in high current gain. Moreover, junction 20 by virtue of conductor 34*a* is at the same potential as 24*b* and operates as a supplementary collector for charge carriers which would otherwise recombine at the surface of the wafer as already explained. Inasmuch as the device is mechanically symmetrical, the same results in the opposite direction are obtained if terminal 30 is biased negative and 32 is biased positive with respect to base 30. In this embodiment both annular junctions, viz., 20 and 24*b*** always function as collectors regardless of the bias polarities applied.

From the foregoing description it will be understood that the relative areas of and spacing between the P-N junctions are important factors and may be determined by analogy to conventional (i.e., single emitter and single collector) transistors. In the most usual case, for example, the area of the annular junctions 20, **24*b*** would be comparable to the difference between emitter and collector areas in a conventional transistor. As in the case of the previously described embodiment, the spacing between the circular and annular junctions would be kept to a practical operative minimum, small as compared to a diffusion length for the charge carrier.

In the foregoing description, the impedance means 36 and 38 have been illustrated and described as simple resistors. It is pointed out that this is merely for the sake of example and literary expediency; resistors 36 and 38 are intended to represent generically any type of resistive impedance operative for the purposes of the invention. While a variety of resistive impedances may be employed, non-linear or asymmetrical resistance means such as diodes are preferred as described in the aforementioned application Serial No. 759,078, wherein the resistive impedance means 36 and 38 comprise a pair of junction diodes connected back-to-back with respect to the annular junctions 20, **24*b***.

It will be appreciated that, while discoid and annular configurations are particularly well suited to semiconductor devices according to the invention for practical as well as theoretical reasons, the inventive concept and its salient principles may be applied to other shapes. By way of example, a semiconductor device 10'' constructed on the basis of a quadrangular configuration is shown in FIGURE 5 from which electrical connections have been omitted for ease of illustration. Device 10'' is identical in all respects except the shape of the elements to the devices 10 or 10', already described; accordingly corresponding parts have been designated with common reference numerals, primed in the case of FIGURE 5, making any further description of structure or function unnecessary.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

I claim:

1. A semiconductor device comprising: a body of semiconductive material having a pair of opposed major surfaces; at least two P-N junctions on one of said major surfaces spaced apart a distance not exceeding a diffusion length for the charge carriers in said material; at least one P-N junction on the other of said surfaces; individual terminal connections for one of said junctions on each of said surfaces; means directly electrically connecting one of the junctions on one of said major surfaces to a junction on the other of said major surfaces; and a base electrode making non-rectifying contact with said body.

2. A semiconductor device comprising: a body of semiconductive material having a pair of opposed major surfaces; at least two P-N junctions on one of said major surfaces spaced apart a distance not exceeding a diffusion length for the charge carriers in said material; a P-N junction on the other of said surfaces opposing the junctions on said one surface; individual terminal connections for one of the junctions on each of said surfaces; means directly electrically connecting that junction on said one surface which does not have a terminal connection to the junction on said other surface; and a base electrode making non-rectifying contact with said body.

3. A semiconductor device comprising: a body of semiconductive material having a pair of opposed major surfaces; an emitter junction on one of said surfaces; a collector junction on the other of said surfaces; a base electrode making non-rectifying contact with said body; and an additional collector junction on said one surface surrounding said emitter junction at a distance smaller than a diffusion length for the charge carriers in said material.

4. A semiconductor device comprising: a body of semiconductive material of one conductivity-type; regions of the opposite conductivity-type on one surface of said body forming therewith two spaced P-N junctions, one surrounding the other at a distance smaller than a diffusion length for the charge carriers in said material; a region of said opposite conductivity-type on an opposite surface of said body forming therewith an additional P-N junction substantially opposing and equal in area to said first-mentioned P-N junctions; a base electrode making non-rectifying contact with an area of said body circumscribing said regions; means electrically connecting the outer one of the two junctions on said one surface of said body to said additional junction; and means for direct individual electrical connection of the inner one of the two junctions on said one surface and said additional junction to respective sources of unidirectional bias potential of opposite polarity relative to said base electrode.

5. A semiconductor device comprising: a wafer of semiconductive material of one conductivity-type; a region of opposite conductivity-type on one major surface of said wafer forming therewith a P-N junction; a second region of said opposite conductivity-type on said one major surface forming therewith a generally annular P-N junction concentric with and spaced from said firstmentioned P-N junction by a distance small as compared to a diffusion length for the charge carriers in said material; a third region of said opposite conductivity-type on the opposite major surface of said wafer forming therewith a generally circular P-N junction concentric with and having a diameter substantially equal to the outer diameter of said annular junction; means directly electrically interconnecting the said second and third regions; means for individually biasing said firstmentioned junction to operate as an emitter and the other junctions to operate as collectors; and a base electrode in non-rectifying contact with said wafer.

6. A semiconductor device comprising: a quadrangular wafer of semiconductive material of one conductivity-type; a region of opposite conductivity-type on one major surface of said wafer forming therewith a P-N junction of solid quadrangular form; a second region of said opposite conductivity-type on said major surface forming therewith a P-N junction of hollow quadrangular form closely surrounding said firstmentioned P-N junction at a distance smaller than a diffusion length for the charge carriers in said material; a third region of said opposite conductivity on the opposite surface of said wafer forming therewith a P-N junction of solid rectangular form opposing said first and second mentioned junctions and having bounding dimensions substantially equal to the corresponding exterior dimensions of said hollow quadrangular junction; means directly electrically interconnecting the said second and third regions; a base electrode making non-rectifying contact with said wafer; and means for individually connecting said first and third regions to respective sources, of bias potential of opposite polarity relative to said base electrode.

7. A semiconductor device comprising: a wafer of semiconductive material having concentric P-N junctions on each major surface spaced apart a distance not exceeding a diffusion length for the charge carriers in said material, the junctions on one major surface being individually substantially identical in area, configuration and location to the respective junctions on the opposite major surface; individual terminal connections for the innermost junction on each said major surface; means directly electrically interconnecting the respective outer junctions on said major surfaces; individual resistive impedance means electrically interconnecting the respective junctions on each said major surface; and a base electrode in non-rectifying contact with said wafer.

8. A semiconductor device according to claim 7 wherein each of said individual resistive impedance means comprises a rectifying junction having high and low impedance conditions depending on the polarity of an applied bias potential, each said rectifying junction being so disposed as to present the same impedance condition for a potential of given polarity applied to said terminal connections.

9. A semiconductor device comprising: a body of semiconductive material of one conductivity-type; regions of the opposite conductivity-type on one surface of said body forming therewith at least two P-N junctions spaced apart a distance not exceeding a diffusion length for the charge carriers in said material; regions of said opposite conductivity-type on an opposite surface of said body forming therewith at least two additional, similarly spaced P-N junctions, each substantially opposing a respective one of the first-mentioned P-N junctions; means electrically connecting one of the junctions on one surface of said body directly to the opposing junction on the opposite surface; individual resistive impedance means, interconnecting the respective junctions on each surface of said body; a base electrode making non-rectifying contact with said body; and means for direct individual electrical connection of one of said regions on said one surface to a source of unidirectional bias potential of one polarity relative to said base electrode and that region on said opposite surface which opposes said one region to a source of unidirectional bias potential of opposite polarity relative to said base electrode.

10. A semiconductor device comprising: a wafer of semiconductive material of one conductivity-type; a region of opposite conductivity-type on each major surface of said wafer forming therewith opposed P-N junctions of substantially equal area; a second region of said opposite conductivity-type on each said major surface forming therewith opposed, generally annular P-N junctions of substantially equal area, closely surrounding said first-mentioned P-N junctions at respective distances not exceeding a diffusion length for the charge carriers in said material; an individual terminal connection in direct electrical contact with each of said first-mentioned regions; means electrically connecting the annular junction on one major surface directly to that on the other major surface; individual asymmetrical resistive impedance means, each having a value of ohmic resistance in one direction comparable in magnitude to that of one of said first-mentioned junctions, each electrically connecting one of said annular junctions to the respective terminal connection; and a base electrode on the peripheral edge of said wafer.

11. A semiconductor device comprising: a quadrangular wafer of semiconductive material of one conductivity-type; a region of opposite conductivity-type on each major surface of said wafer forming therewith opposed, P-N junctions of solid quadrangular form and substantially equal area; a second region of said opposite conductivity-type on each said major surface forming therewith opposed, P-N junctions of hollow quadrangular form and substantially equal area, each closely surrounding a respective one of said first-mentioned P-N junctions at a distance smaller than a diffusion length for the charge carriers in said material; individual resistive impedance means electrically interconnecting the respective regions on each of said surfaces; means electrically interconnecting the outermost junction on one major surface directly to that on the other major surface; means for individually connecting each of said first-mentioned regions to a source of bias potential; and a base electrode making non-rectifying contact with said wafer.

References Cited in the file of this patent

UNITED STATES PATENTS 2,709,232 Thedieck ---------------- May 24, 1955
2,754,431 Johnson ---------------- July 10, 1956
2,801,347 Dodge ---------------- July 30, 1957
2,801,348 Pankove ---------------- July 30, 1957
2,847,583 Hung ---------------- Aug. 12, 1958
2,883,313 Pankove ---------------- Apr. 21, 1959

FOREIGN PATENTS 1,129,770 France ---------------- Jan. 25, 1957